United States Patent [19]

Tsai et al.

[11] Patent Number: 5,019,534

[45] Date of Patent: May 28, 1991

[54] PROCESS OF MAKING SELF-ALIGNED CONTACT USING DIFFERENTIAL OXIDATION

[75] Inventors: Nan-Hsiung Tsai, Cupertino; Yun-Sheng Hwang, Sunnyvale, both of Calif.

[73] Assignee: MOS Electronics, Sunnyvale, Calif.

[21] Appl. No.: 429,580

[22] Filed: Oct. 31, 1989

[51] Int. Cl.$^5$ .......................................... H01L 21/473
[52] U.S. Cl. ...................... 437/200; 437/41; 437/985; 437/239; 148/DIG. 19
[58] Field of Search .............. 437/200, 192, 193, 201, 437/202, 239, 40, 41, 985; 357/71; 148/DIG. 147, DIG. 19

[56] References Cited

U.S. PATENT DOCUMENTS

| | | | |
|---|---|---|---|
| 4,228,212 | 10/1980 | Brown et al. | 148/DIG. 147 |
| 4,593,454 | 6/1986 | Baudrant et al. | 148/DIG. 147 |
| 4,742,025 | 5/1988 | Ohyu et al. | 437/225 |

OTHER PUBLICATIONS

Chow, T. P. et al., *IEEE Transaction on Electron Devices*, vol. Ed-30, No. 11, Nov. 1983, pp. 1480–1497.

*Primary Examiner*—Brian E. Hearn
*Assistant Examiner*—T. N. Quach
*Attorney, Agent, or Firm*—Skjerven, Morrill, MacPherson, Franklin & Friel

[57] ABSTRACT

A process of forming a self-aligned oxide layer covering conductive structures such as MOS transistor gates above a semiconductive substrate while portions of the substrate such as source/drain regions are exposed involves forming side wall spacers against the gates, applying refractory metal to the exposed surface, heating the refractory metal so that it forms refractory silicide at regions where the refractory metal contacts the substrate, removing the unreacted refractory metal, and oxidizing the exposed refractory silicide with a low temperature wet oxidation which causes faster oxide growth above the highly doped gates than above the lightly doped source/drain regions. Subsequent etching of the differentially grown oxide layer exposes the source/drain regions while leaving protected the gate regions. Since no mask was needed for forming and patterning the gate-covering oxide, no misalignment can occur and thus no space need be allowed in the circuit layout for misalignment. In one embodiment, spacing between adjacent MOS transistor gates is reduced from 2.4 microns to 1.2 microns.

10 Claims, 4 Drawing Sheets

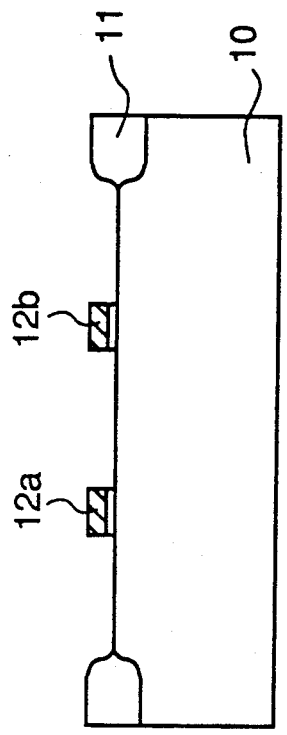
FIG. 1.1a
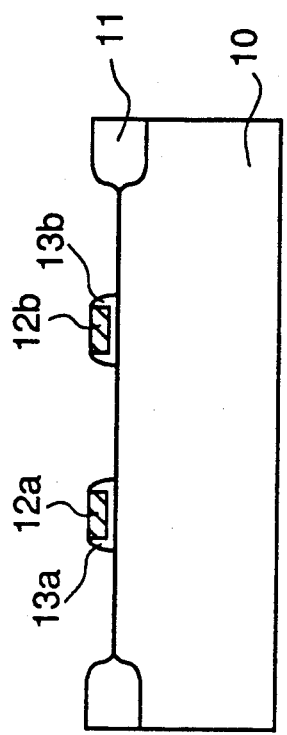
FIG. 1.2a
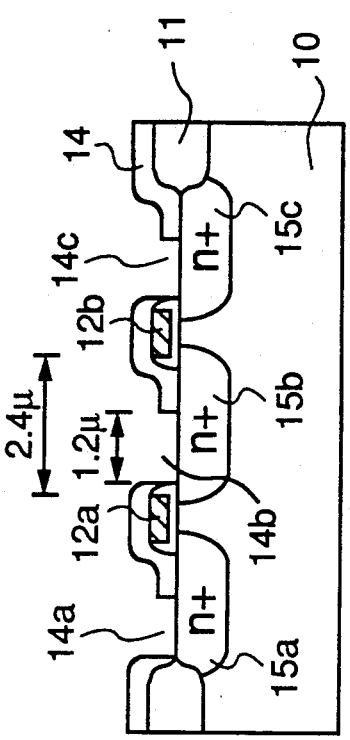
FIG. 1.3a
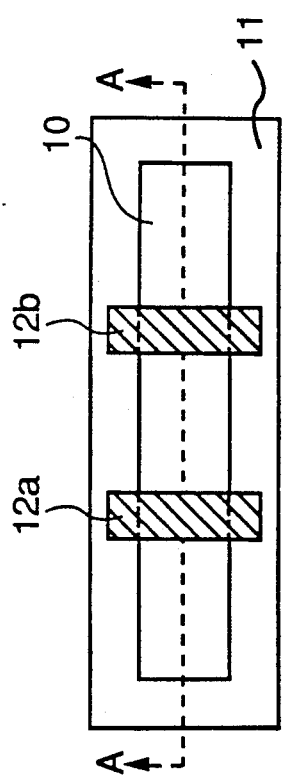
FIG. 1.1b
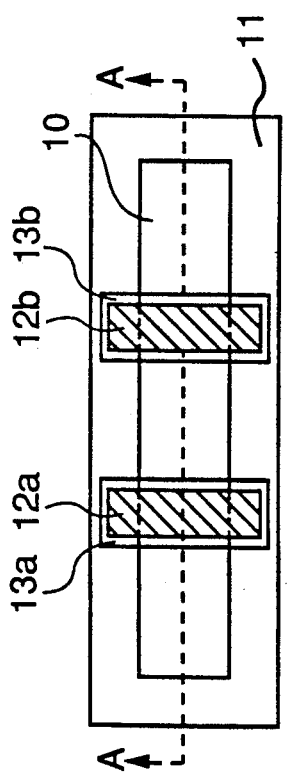
FIG. 1.2b
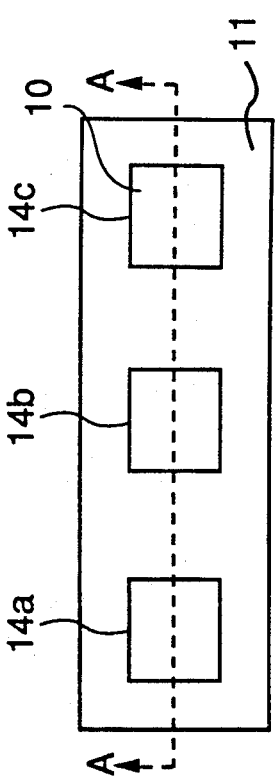
FIG. 1.3b

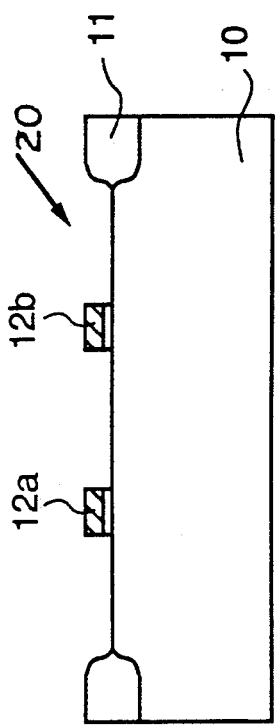
FIG. 2.1b
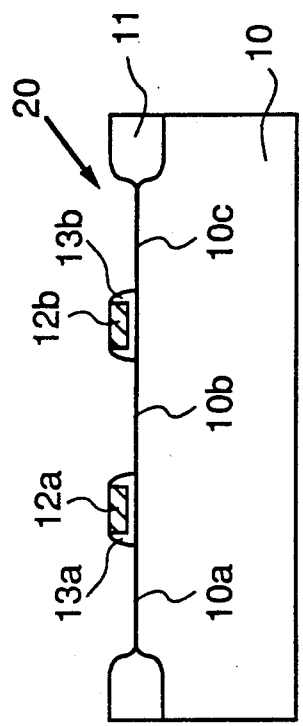
FIG. 2.2b
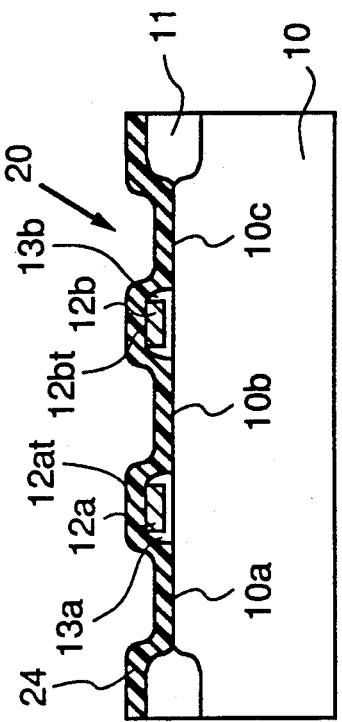
FIG. 2.3b
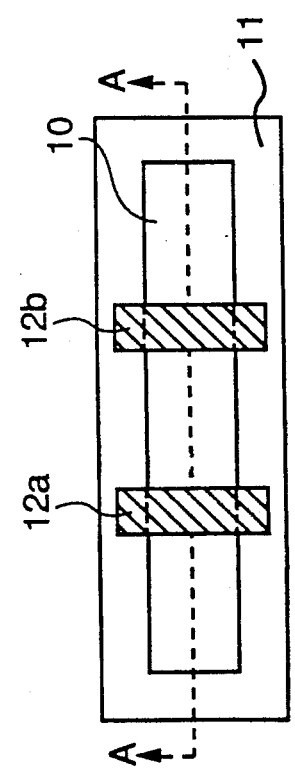
FIG. 2.1a
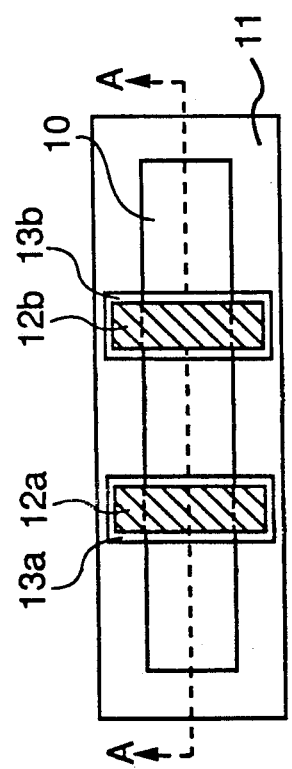
FIG. 2.2a
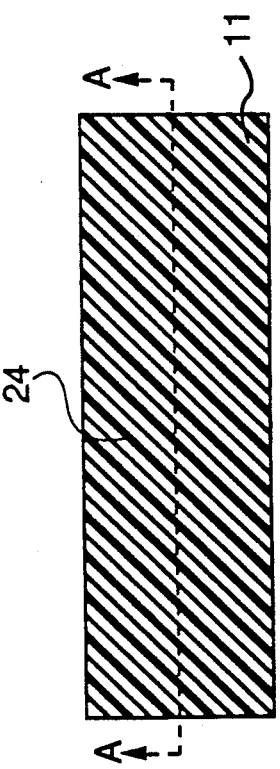
FIG. 2.3a

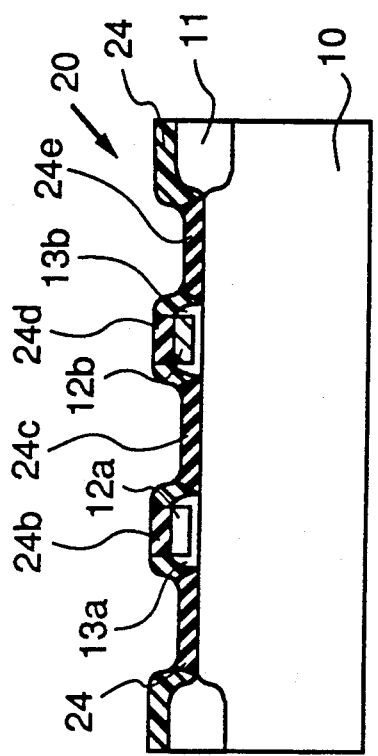
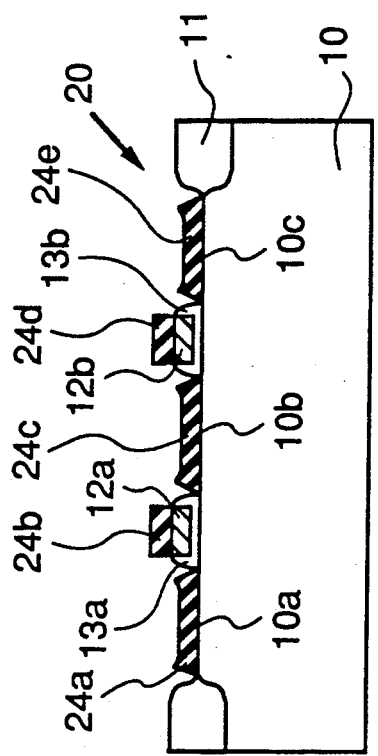
FIG. 2.4b
FIG. 2.5b
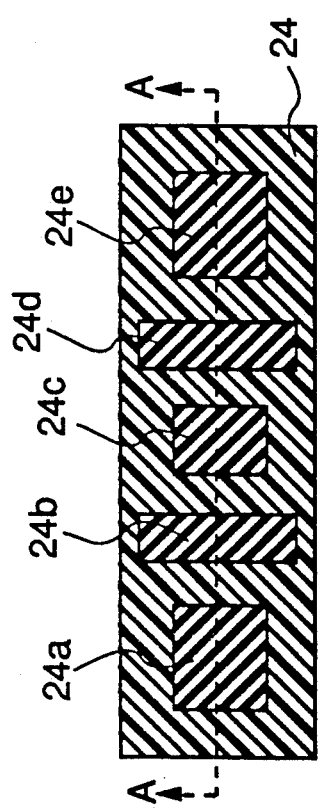
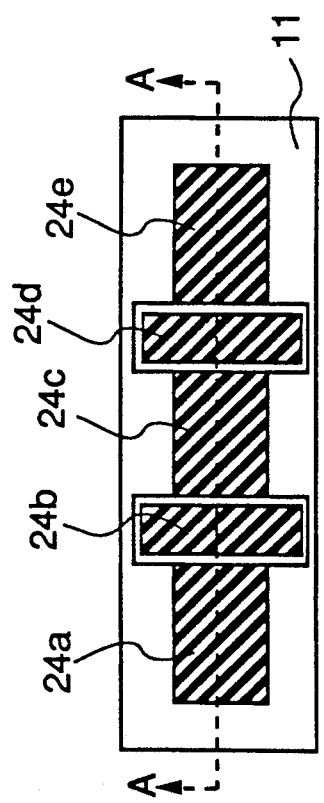
FIG. 2.4a
FIG. 2.5a

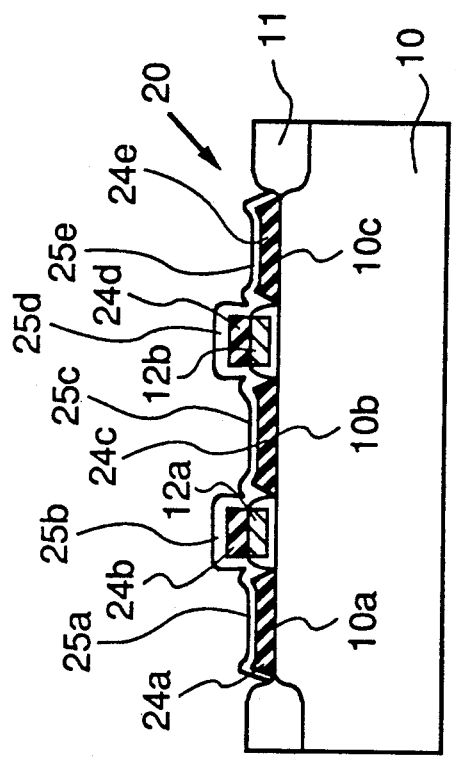
FIG. 2.6b
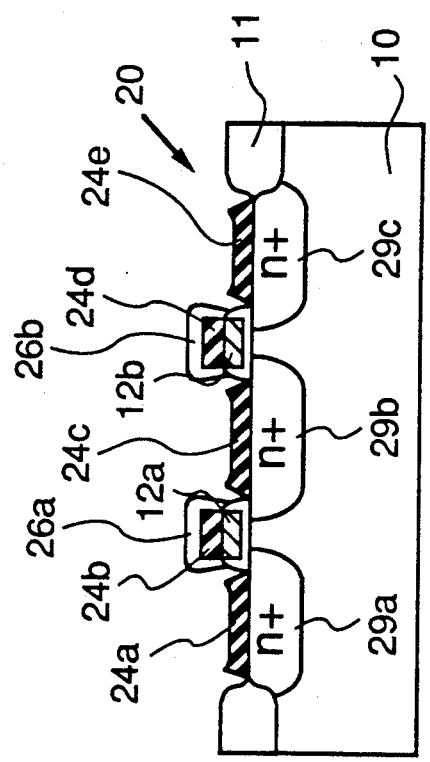
FIG. 2.7b
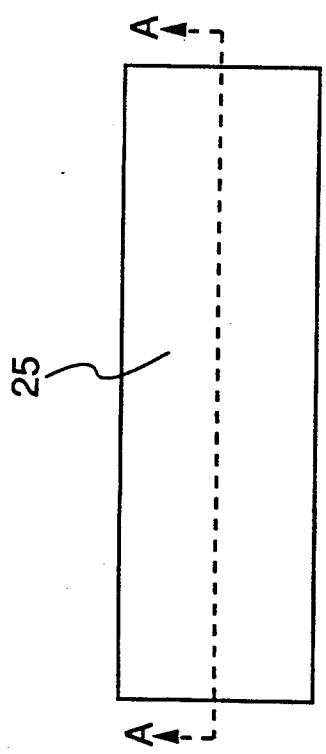
FIG. 2.6a
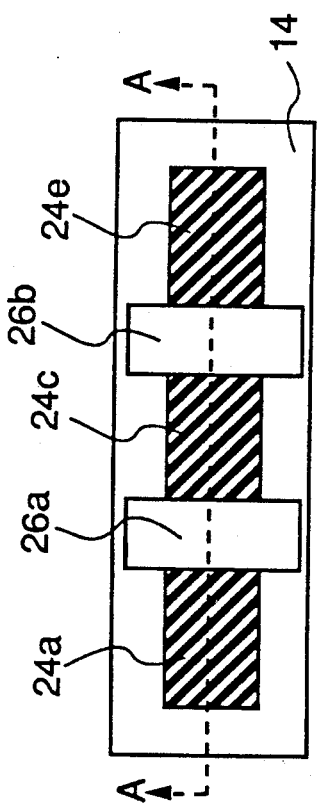
FIG. 2.7a

PROCESS OF MAKING SELF-ALIGNED CONTACT USING DIFFERENTIAL OXIDATION

FIELD OF THE INVENTION

This invention relates to integrated circuit structures and the process for making them, more particularly to forming a self-aligned conductive substrate contact.

BACKGROUND OF THE INVENTION

There is a persistent goal in the semiconductor industry of making smaller elements in an integrated circuit structure so that more elements can be located on a single integrated circuit chip, and so that the elements have lower power requirement, lower capacitance, and higher operating speed. A widely used circuit element is a MOS transistor, in which a gate of polycrystalline silicon is located above the semiconductive substrate and source/drain regions are located in the substrate on either side of the gate. Gate arrays and other arrangements frequently employ adjacent MOS transistors which may share source/drain regions. FIGS. 1.1a through 1.3a and 1.1b through 1.3b show successive steps in the formation of a prior art structure having two adjacent MOS transistors sharing a central source/drain region. FIGS. 1.1a through 1.3a show top views of the structure and FIGS. 1.1b through 1.3b show side cross sectional views taken along line A—A. The same elements are indicated by the same reference numerals in successive figures.

As shown in FIGS. 1.1a and 1.1b, two gates 12a and 12b extend across an exposed portion of substrate 10, which is surrounded by field oxide region 11. FIGS. 1.2a and 1.2b show insulating (typically silicon dioxide) side wall spacer regions 13a and 13b. These spacers are formed by well known processes. Typically this step is followed by formation of an insulation layer 14 such as silicon dioxide, which is patterned to form vias such as 14a, 14b, and 14c which expose substrate 10. Into these exposed substrate regions are implanted source/drain regions 15a, 15b, and 15c, which are shown in FIG. 1.3b as n+regions, but can of course be p-type regions if desired. A conductive material (not shown) is applied to the surface of the wafer and patterned to form contacts.

The above process requires separate masking steps, first for forming the gates and source/drain regions and second for opening the vias for contacting the conductive contacts. The two masks are not self aligned. Therefore, space must be allocated in the layout of the elements within the chip to allow for misalignment of these two masks. FIG. 1.3b shows contact openings 14a, 14b, and 14c misaligned with respect to gates 12a and 12b. According to one set of design rules, a minimum via opening for a contact is 1.2 microns and misalignment allowance must be 0.6 micron at either side of a gate. Therefore spacing between adjacent walls of adjacent gates must be 2.4 microns, as shown in FIG. 1.3b in order to allow for the 1.2 micron via with insulation remaining at the sidewalls of gates 12a and 12b in order to separate the substrate contact which will extend into openings 14a, 14b, and 14c from gates 12a and 12b.

It is beneficial to avoid having to allocate space for this misalignment.

SUMMARY OF THE INVENTION

The present invention provides a method and resulting structure for forming source/drain or other substrate contacts which are self-aligned with adjacent structures such as gates which have been located above the substrate. As in the prior art process described above, the present invention uses side wall spacers formed adjacent the gates (or other structures).

After the prior art step of forming the side wall spacers and exposing top surfaces of both the substrate regions to be contacted and the polysilicon gates (or other doped conductive structures above the substrate), in contrast to the prior art process, a layer of refractory metal is formed on the surface of the wafer. This refractory metal contacts exposed top surfaces of both the substrate source/drain (or other exposed substrate regions) and the gates (or other doped conductive regions). Subsequent heating produces a refractory metal silicide in locations where refractory metal directly contacts silicon. Thus the top layer comprises a combination of silicide above the source/drains and gates (or other silicon structures) and unreacted refractory metal adjacent the oxide side wall spacers. An acid etch removes the unreacted refractory metal but leaves the silicide.

Subsequently, and surprisingly, oxidation in a relatively low temperature (800° C.) wet environment produces thicker oxide adjacent highly doped gates than adjacent lightly doped substrate regions. This means that a subsequent oxide etch, which removes oxide evenly everywhere can fully expose the substrate regions while fully covering the gates or other doped polysilicon structures. The resulting structure is at the same stage as the prior art structure in which the gates are covered on all sides with insulation and substrate regions are ready for formation of conductive contact regions, but according to the present invention, the oxide covering is self-aligned with the gates (or other structures) and thus there is no need for a layout space allocation for misalignment of the contact openings. Additionally, since the contact opening is not formed using a photoresist mask, the minimum prior art opening size is not required, even for the same design rules. Using the same design rule example as with the above prior art structure, the spacing between gates may be reduced from 2.4 microns to 1.2 microns.

BRIEF DESCRIPTION OF THE DRAWINGS

FIGS. 1.1a through 1.3a show top views of steps in forming a prior art MOS transistor pair.

FIGS. 1.1b through 1.3b show side cross sectional views of FIGS. 1.1a through 1.3a.

FIGS. 2.1a through 2.7a show top views of steps in forming a MOS transistor pair with self aligned gate oxide according to the present invention.

FIGS. 2.1b through 5.7b show side cross sectional views of FIGS. 2.1a through 2.7a.

DETAILED DESCRIPTION OF A PREFERRED EMBODIMENT

FIGS. 2.1a through 2.7a and 2.1b through 2.7b show successive steps in the process of the present invention as applied to a preferred embodiment. The device shown is a pair of adjacent MOS transistors, as was the device described with respect to the prior art. FIGS. 2.1a through 2.7a show top views and FIGS. 2.1b through 2.7b show side cross sectional views taken along line A—A of FIGS. 2.1a through 2.7a respectively. Elements which are the same as prior art elements of FIGS. 1.1a through 1.3a and 1.1b through 1.3b are given the same reference numerals.

FIGS. 2.1a, 2.1b, 2.2a and 2.2b show steps identical to those described above with respect to the prior art, except that the separation between adjacent structures is able to be smaller for the same design rules when the following steps of the present invention are used.

As shown in FIGS. 2.3a and 2.3b, a refractory metal 24 such as tungsten, platinum, tantalum, molybdenum, or titanium is formed on the surface of structure 20, contacting side wall spacers 13a, 13b, substrate regions 10a, 10b, and 10c, and top surfaces 12at and 12bt of gates 12a and 12b. This refractory metal layer is preferably formed by sputtering or CVD deposition and preferably has a thickness of 200 nm to 500 nm.

As shown in FIGS. 2.4a and 2.4b, the refractory metal is caused to react with the silicon at points of contact, preferably by bringing the temperature of the wafer to approximately 800° C. for a period of approximately 60 minutes. Regions 24a, 24b, 24c, 24d, and 24e become refractory silicide while the remaining portions of layer 24, which are in contact with oxide, remain unreacted refractory metal.

As shown in FIGS. 2.5a and 2.5b, the unreacted refractory metal is removed, preferably by etching with sulfuric acid, 50% by volume, at a temperature between 27° C. and 80° C., though nitric and hydrochloric acid at similar temperatures and concentrations produce satisfactory results.

Gates 12a and 12b are preferably doped with phosphorus to a doping level of $10^{21}$ ions/cm$^3$ whereas substrate 10 has a doping level on the order of $10^{16}$ ions/cm$^3$ of boron. Of course, other dopants can be used. The refractory silicide in regions 24b and 24d above heavily doped gates 12a and 12b respectively reacts at a relatively high rate to form oxide, while the refractory silicide in regions 24a, 24c, and 24e above the lightly doped substrate regions 10a, 10b, and 10c reacts more slowly in forming oxide. This difference is taken advantage of in the next crucial step.

As shown in FIGS. 2.6a and 2.6b, the surface of wafer 20 is oxidized, forming oxide layer 25, using low temperature wet oxidation at preferably 800° C. The dopant ions present in heavily doped polysilicon gate regions 12a and 12b cause a higher oxidation rate in oxide regions 25b and 25d than the oxidation rate in oxide regions 25a, 25c, and 25e above refractory silicide regions 24a, 24c, and 24e adjacent substrate regions 10a, 10b, and 10c which contain fewer dopants. Oxidation of regions above already existing oxide regions occurs hardly at all. Oxidation preferably continues for about 3 hours until the thickness of oxide regions 25b and 25d is on the order of 200 nm. At this point, the thickness of oxide regions 25a, 25c, and 25e will be 50-70 nm.

As shown in FIGS. 2.7a and 2.7b, an isotropic RIE (reactive ion etching) etch for approximately one minute (depending on the etching equipment being used) will remove approximately 100 nm of exposed oxide. This completely exposes refractory silicide regions 24a, 24c, and 24e while leaving about 100 nm of oxide covering gates 12a and 12b and refractory silicide regions 24b and 24d. The oxide of side wall spacers 13a and 13b completes the insulation of gates 12a and 12b. At this point implantation of source/drain regions 27a, 27b, and 27c may take place.

Thus the oxide insulation on gates 12a and 12b is self-aligned with gates 12a and 12b, and source/drain regions 27a, 27b, and 27c are ready for forming conductive contacts which will be electrically isolated from the adjacent gates. The separation between gates 12a and 12b is determined by the minimum design rule for gate spacing, in the present example 1.2 microns as determined by a photoresist mask, and no additional separation is required for misalignment of a later mask.

Though the above description applies to a pair of MOS transistors, formation of other structures using the method of this invention will be obvious to those skilled in the art in light of the above disclosure. All such variations are intended to fall within the scope of the present invention.

We claim:

1. A method for forming an integrated circuit structure comprising the steps of:

forming above a silicon substrate conductive structures of polysilicon, said conductive structures having top surfaces and sidewalls, said polysilicon being sufficiently more heavily doped than said silicon substrate that a subsequent step of oxidizing a refractory silicide to be formed on said silicon substrate and said polysilicon conductive structures is sufficiently faster above said polysilicon conductive structures than above said silicon substrate that uniform oxide removal can expose said silicide above said silicon substrate and not expose said silicide above said polysilicon conductive structures;

forming sidewall spacers against said sidewalls, said sidewall spacers being formed from an electrically insulating material;

forming a layer of refractory metal on a top surface of said integrated circuit structure, said refractory metal contacting said top surfaces of said conductive structures, said side wall spacers, and exposed portions of said silicon substrate;

heating said integrated circuit structure sufficiently to cause portions of said refractory metal which contact said top surfaces of said conductive structures and said exposed portions of said silicon substrate to form said refractory silicide;

removing unreacted portions of said refractory metal;

oxidizing said refractory silicide; and removing oxide using a process which occurs at a constant rate for all exposed oxide, said removing continuing to an extent which exposes said refractory silicide contacting said silicon substrate and does not expose said refractory silicide contacting said conductive structures.

2. Method as in claim 1 in which said silicon substrate is lightly doped silicon.

3. Method as in claim 2 in which said lightly doped silicon is doped to a level between $10^{15}$ ions/cm$^3$ and $10^{18}$ ions/cm$^3$.

4. Method as in claim 2 in which said doped material is polycrystalline silicon doped to a level between $10^{19}$ ions/cm$^3$ and $10^{22}$ ions/cm$^3$.

5. Method as in claim 1 in which said sidewall spacers are of silicon dioxide.

6. Method as in claim 1 in which said refractory metal is taken from the group consisting of platinum, titanium, tungsten, molybdenum, and tantalum.

7. Method as in claim 1 in which said refractory metal layer has a thickness of 200 nm to 500 nm and said step of heating said integrated circuit structure comprises heating to a temperature of 800° C. to 1000° C. for a time of 30 minutes to 90 minutes.

8. Method as in claim 1 in which said step of removing unreacted portions of said refractory metal comprises etching with sulfuric acid, 50% by volume, at a temperature between 27° C. and 80° C. for a period of 10 minutes to one hour.

9. Method as in claim 1 in which said step of oxidizing said refractory metal comprises heating said wafer to a temperature of 800° C. in an atmosphere of water and oxygen.

10. Method as in claim 1 in which said step of removing oxide using a process which occurs at a constant rate comprises etching said oxide using RIE etching for a time of 30 seconds to 90 seconds.

* * * * *

UNITED STATES PATENT AND TRADEMARK OFFICE
CERTIFICATE OF CORRECTION

PATENT NO.   : 5,019,534
DATED        : May 28, 1991
INVENTOR(S)  : Nan-Hsiung Tsai et al.

It is certified that error appears in the above-identified patent and that said Letters Patent is hereby corrected as shown below:

Column 4, line 53 (claim 4) "doped material is" should be deleted.

Column 4, line 54 (claim 4) after "silicon" insert --is--.

Signed and Sealed this

Eighteenth Day of May, 1993

Attest:

MICHAEL K. KIRK

Attesting Officer

Acting Commissioner of Patents and Trademarks